United States Patent
Zhang et al.

(10) Patent No.: US 9,748,276 B2
(45) Date of Patent: Aug. 29, 2017

(54) THIN FILM TRANSISTOR AND METHOD OF MANUFACTURING THE SAME, ARRAY SUBSTRATE AND DISPLAY DEVICE

(71) Applicant: BOE TECHNOLOGY GROUP CO., LTD., Beijing (CN)

(72) Inventors: Feng Zhang, Beijing (CN); Zhanfeng Cao, Beijing (CN); Qi Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/769,438

(22) PCT Filed: Oct. 21, 2014

(86) PCT No.: PCT/CN2014/089037
§ 371 (c)(1),
(2) Date: Aug. 20, 2015

(87) PCT Pub. No.: WO2016/008226
PCT Pub. Date: Jan. 21, 2016

(65) Prior Publication Data
US 2016/0247830 A1 Aug. 25, 2016

(30) Foreign Application Priority Data
Jul. 14, 2014 (CN) .......................... 2014 1 0334150

(51) Int. Cl.
*H01L 27/12* (2006.01)
*H01L 29/78* (2006.01)
(Continued)

(52) U.S. Cl.
CPC ........ *H01L 27/1225* (2013.01); *H01L 27/127* (2013.01); *H01L 29/22* (2013.01);
(Continued)

(58) Field of Classification Search
CPC ............. H01L 27/1225; H01L 29/7869; H01L 27/127; H01L 29/78618; H01L 29/78696;
(Continued)

(56) References Cited

U.S. PATENT DOCUMENTS 6,882,012 B2    4/2005  Yamazaki et al.
2004/0183072 A1* 9/2004  Kim .................. H01L 29/41733
                                                              257/59
(Continued)

FOREIGN PATENT DOCUMENTS

CN         1888961 A      1/2007
CN       101145561 A      3/2008
(Continued)

OTHER PUBLICATIONS

International Search Report and Written Opinion in Chinese for PCT Application No. PCT/CN2014/089037 dated Apr. 15, 2015, 17 pages.
(Continued)

*Primary Examiner* — Allen Parker
*Assistant Examiner* — Didarul Mazumder
(74) *Attorney, Agent, or Firm* — Kinney & Lange, P.A.

(57) ABSTRACT

The present invention discloses a thin film transistor, comprising a gate electrode (2), a gate insulating layer (3), and active layer (4), and etching barrier layer (7), a source electrode and a drain electrode, wherein the source electrode comprises a first source electrode (5) and a second source electrode (8) electrically connected therewith, the drain electrode comprises a first drain electrode (6) and a second drain electrode (9) electrically connected therewith, the first source electrode and first drain electrode are formed on the active layer, the etching barrier layer at least covers a portion of the active layer between the first source electrode and the first drain electrode, and respectively covers portions of the
(Continued)

first source electrode (5) and the first drain electrode (6) adjacent to each other, and the second source electrode and the second drain electrode are formed on the etching barrier layer. The present invention further discloses a method of manufacturing a thin film transistor, an array substrate and a display device both comprising the thin film transistor. The thin film transistor formed according to the present invention has a short channel length, which increases an on-state current of the thin film transistor while improving ohmic contact between the source and drain electrodes and the active layer, thereby increasing the stability of the thin film transistor.

19 Claims, 3 Drawing Sheets

(51) Int. Cl.
*H01L 29/22* (2006.01)
*H01L 21/16* (2006.01)
*H01L 21/00* (2006.01)
*H01L 29/24* (2006.01)
*H01L 21/47* (2006.01)
*H01L 29/786* (2006.01)

(52) U.S. Cl.
CPC .... *H01L 29/7869* (2013.01); *H01L 29/78618* (2013.01); *H01L 29/78696* (2013.01)

(58) Field of Classification Search
CPC ......... H01L 29/22; H01L 21/16; H01L 21/00; H01L 29/24; H01L 21/479
USPC ................. 257/43; 438/85, 86, 104, 754
See application file for complete search history.

(56) References Cited

U.S. PATENT DOCUMENTS

| | | | |
|---|---|---|---|
| 2008/0277658 A1* | 11/2008 | Lee | H01L 29/7869 257/43 |
| 2008/0296568 A1* | 12/2008 | Ryu | H01L 21/02554 257/43 |
| 2011/0049523 A1* | 3/2011 | Choi | H01L 27/1225 257/43 |
| 2011/0163310 A1* | 7/2011 | Park | H01L 29/78606 257/43 |
| 2011/0198584 A1* | 8/2011 | Yang | H01L 27/3262 257/43 |
| 2011/0303918 A1* | 12/2011 | Im | H01L 27/1225 257/59 |
| 2012/0097955 A1 | 4/2012 | Wu et al. | |
| 2013/0168667 A1* | 7/2013 | Tsang | H01L 29/66969 257/43 |
| 2014/0239290 A1* | 8/2014 | Kim | H01L 29/7869 257/43 |

FOREIGN PATENT DOCUMENTS

| | | |
|---|---|---|
| CN | 101728433 A | 6/2010 |
| CN | 102576738 A | 7/2012 |
| CN | 102713735 A | 10/2012 |
| CN | 103219391 | 7/2013 |
| CN | 103247693 A | 8/2013 |
| CN | 103403850 A | 11/2013 |

OTHER PUBLICATIONS

First Chinese Office Action for Chinese Patent Application No. 2014103341506, dated Aug. 1, 2016, 13 pages.
Second Chinese Office Action, for Chinese Patent Application No. 2014103341506, dated Jan. 3, 2017, 9 pages.
Third Chinese Office Action, for Chinese Patent Application No. 201410334150.6, dated Mar. 17, 2017, 9 pages.

* cited by examiner

THIN FILM TRANSISTOR AND METHOD OF MANUFACTURING THE SAME, ARRAY SUBSTRATE AND DISPLAY DEVICE

BACKGROUND OF THE INVENTION

Field of the Invention

The present disclosure relates to the field of display technologies, and particularly, to a thin film transistor (TFT) and a method of manufacturing the same, and an array substrate and a display device comprising the thin film transistor.

Description of the Related Art

An organic light-emitting diode (OLED) display may be made to be lighter and thinner, has a larger visual angle and no radiation, and significantly saves electric energy. Thus, the organic light-emitting diode display dominates the flat panel display device market, and is considered as the most likely next generation of new flat panel display. In an Active matrix OLED, a thin film transistor is provided as a switch to control each pixel, and the thin film transistor generally comprises a gate electrode, a source electrode, a drain electrode, a gate insulating layer and an active layer.

Both oxides, such as an indium gallium zinc oxide (IGZO), an indium tin zinc oxide (ITZO) and the like, and amorphous silicon, can be used as materials for manufacturing the active layer of the thin film transistor. Compared to the amorphous silicon thin film transistor, the oxide thin film transistor has a carrier concentration which is about ten times of that of the amorphous silicon thin film transistor, and a carrier mobility which is 20 to 30 times of that of the amorphous silicon thin film transistor. Thus, the oxide thin film transistor can greatly increase charging and discharging rates to a pixel electrode through the thin film transistor and thus a response speed of the pixel, thereby achieving a quicker refresh rate. The oxide thin film transistor is applicable in situations where a quick response and a larger current are required, such as a high frequency, high resolution and large-sized display, an organic light emitting display or the like. Therefore, the oxide thin film transistor becomes a semiconductor component of the new generation of LCD and OLED display devices.

FIG. 1A is a schematic structural diagram of an etching barrier type oxide thin film transistor in prior arts, and FIG. 1B is a sectional view of the oxide thin film transistor taken along a line A-A' shown in FIG. 1A. As shown in FIG. 1B, 110 indicates a substrate, 120 indicates a gate electrode, 130 indicates a gate insulating layer, 140 indicates an active layer, 150 indicates an etching barrier layer, and 160 indicates source/drain electrodes. In the existing oxide thin film transistor, since an oxide semiconductor layer is often made of an amorphous silicon oxide, it is difficult to form an ohmic contact between the oxide semiconductor layer and a source/drain (SD) metal layer, thereby resulting in a bad stability of the thin film transistor. In addition, a channel length of the thin film transistor will have an effect on an on-state current of the thin film transistor, that is, the smaller the channel length is, the larger the on-state current of the thin film transistor is. In the existing etching barrier type oxide thin film transistor, however, the etching barrier layer is formed before the source and drain electrodes, so that the channel length D1 (FIG. 1B) of the oxide thin film transistor corresponding to the size of the etching barrier layer is large, and the on-state current is small, which greatly degrades performances of the thin film transistor and is unfavorable for development of high-performance display devices.

SUMMARY OF THE INVENTION

In order to solve at least one of the above and other problems in prior art, the present disclosure provides a thin film transistor and a method of manufacturing the same, and an array substrate and a display device comprising the thin film transistor.

According to one aspect of the present disclosure, there is provided a thin film transistor, comprising an active layer, an etching barrier layer, a gate electrode, a gate insulating layer, a source electrode and a drain electrode, wherein the source electrode comprises a first source electrode and a second source electrode, the drain electrode comprises a first drain electrode and a second drain electrode, and the first source electrode and first drain electrode are formed on the active layer, the etching barrier layer at least covers a portion of the active layer between the first source electrode and the first drain electrode and respectively covers a portion of the first source electrode and a portion of the first drain electrode adjacent to each other, the second source electrode and the second drain electrode are formed on the etching barrier layer, and the second source electrode is electrically connected with the first source electrode, and the second drain electrode is electrically connected with the first drain electrode.

In the above thin film transistor, a first through hole and a second through hole may be formed in the etching barrier layer at positions respectively corresponding to the first source electrode and the first drain electrode, such that the second source electrode may be at least partially located within the first through hole and electrically contacts the first source electrode, and the second drain electrode may be at least partially located within the second through hole and electrically contacts the first drain electrode.

In the above thin film transistor, a spacing distance between the first source electrode and the first drain electrode is smaller than a spacing distance between the first through hole and the second through hole in the etching barrier layer.

In the above thin film transistor, the first source electrode and the first drain electrode are formed by the same first electrode material layer deposited on the active layer, the second source electrode and the second drain electrode formed by the same second electrode material layer deposited on the etching barrier layer, and a thickness of the first electrode material layer may be smaller than that of the second electrode material layer.

The above thin film transistor may further comprise an oxide layer formed on the first source electrode and the first drain electrode, the oxide layer being a metal oxide layer formed by thermally treating the first source electrode and the first drain electrode.

In the above thin film transistor, a material for manufacturing the first drain electrode and/or first source electrode may comprise aluminum or aluminum alloy.

In the above thin film transistor, the active layer may be formed by a metal oxide semiconductor material. The metal oxide semiconductor material may comprise a zinc oxide material.

In the above thin film transistor, the active layer may contains therein the same metal atoms as the first source electrode and the first drain electrode.

According to another aspect of the present disclosure, there is provided an array substrate, comprising a substrate and the above thin film transistor formed on the substrate.

According to a further aspect of the present disclosure, there is provided a display device, comprising the above array substrate.

According to a still further aspect of the present disclosure, there is provided a method of manufacturing a thin film transistor, comprising steps of:

forming a semiconductor layer on a substrate, and patterning the semiconductor layer to form an active layer;

forming a first electrode material layer on the substrate formed with the active layer, and patterning the first electrode material layer to form a first source electrode and first drain electrode on the active layer;

forming an etching barrier material layer on the substrate, and patterning the etching barrier material layer to form an etching barrier layer, the etching barrier layer at least covering a portion of the active layer between the first source electrode and the first drain electrode and respectively covering a portion of the first source electrode and a portion of the first drain electrode adjacent to each other; and forming a second electrode material layer on the substrate formed with the etching barrier layer, and patterning the second electrode material layer to form a second source electrode and a second drain electrode, wherein the first source electrode is electrically connected with the second source electrode, and the first drain electrode is electrically connected with the second drain electrode.

In the above method, the step of patterning the etching barrier material layer may comprise: forming, in the etching barrier material layer, a first through hole to expose at least a portion of the first source electrode and a second through hole to expose at least a portion of the first drain electrode, wherein the second source electrode may be at least partially located within the first through hole and is in electrical contact with the first source electrode, and the second drain electrode is at least partially located within the second through hole and is in electrical contact with the first drain electrode.

In the above method, a spacing distance between the first source electrode and the first drain electrode is smaller than a spacing distance between the first through hole and the second through hole in the etching barrier layer.

In the above method, a thickness of the first electrode material layer may be smaller than that of the second electrode material layer.

The method may further comprise, after forming the first source electrode and the first drain electrode, thermally treating the first source electrode and the first drain electrode so as to form a metal oxide layer in surfaces of the first source electrode and the first drain electrode. The first source electrode and the first drain electrode may be thermally treated through an annealing process.

In the above method, a material for manufacturing the first drain electrode and/or first source electrode may comprise aluminum or aluminum alloy.

In the above method, the active layer may be formed by a metal oxide semiconductor material. The metal oxide semiconductor material may comprise a zinc oxide material.

DETAILED DESCRIPTION OF PREFERRED EMBODIMENTS OF THE INVENTION

Figure 1A:
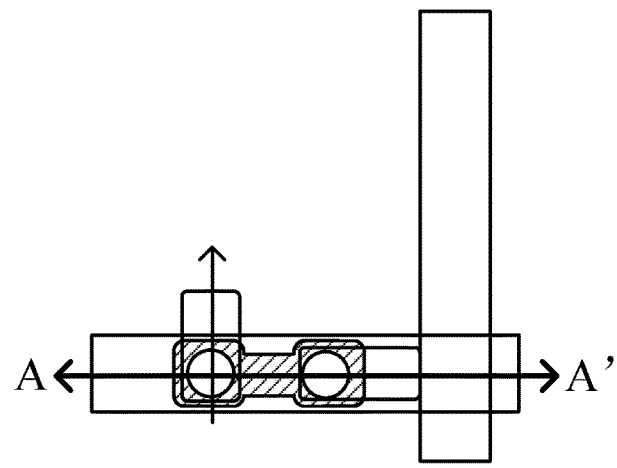
FIG. 1A is a plan view of an oxide thin film transistor in prior arts.
Figure 1B:
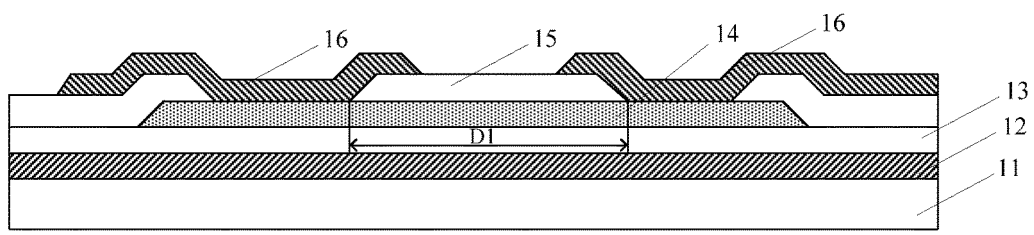
FIG. 1B is a sectional view of the oxide thin film transistor taken along a line A-A' shown in FIG. 1A.

In order to provide a more clear understanding of objects, technique solutions and advantages of the present invention, the present invention will be further described hereinafter in detail in conjunction with preferred embodiments and with reference to the attached drawings.

Further, in the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
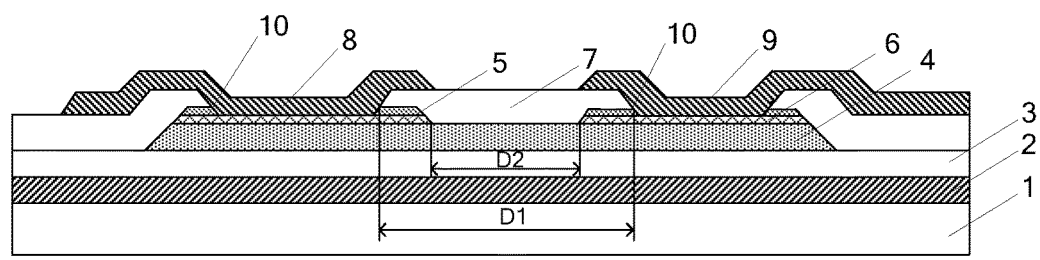
FIG. 2 is a schematic structural diagram of a thin film transistor according to an embodiment of the present disclosure.

FIG. 2 shows a structure of a thin film transistor according to an exemplary embodiment of the present disclosure. As shown in FIG. 2, the thin film transistor comprises a gate electrode 2, a gate insulating layer 3, an active layer 4, an etching barrier layer 7, a source electrode and a drain electrode, for example, formed on a substrate 1.

In one example, the source electrode includes a first source electrode 5 and a second source electrode 8, the drain electrode comprises a first drain electrode 6 and a second drain electrode 9, and the first source electrode 5 and first drain electrode 6 are formed on the active layer 4 and are spaced apart from each other by a distance D2. As known by those skilled in the art, a portion of the active layer 4 between the first source electrode 5 and the first drain electrode 6 is a channel portion or region, and in this example, a length of the channel region, that is, a channel length, is equal to D2.

The active layer 4 may be made of a metal oxide semiconductor material, preferably, an oxide semiconductor material having a rather high carrier mobility, such as zinc oxynitride (ZnON), indium gallium zinc oxide (IGZO), indium zinc oxide (IZO), indium tin zinc oxide (ITZO) or the like.

The source electrode and the drain electrode are made of conductive materials, which are preferably metal materials, for example, common metal such as aluminum, zinc, tin, molybdenum, tungsten, titanium or the like, or metal alloy materials, preferably, aluminum or aluminum alloy.

The etching barrier layer 7 at least covers a portion of the active layer between the first source electrode 5 and the first drain electrode 6, that is, covers the channel region. At least the channel region in the active layer 4 is covered by the etching barrier layer 7, so that the channel region in the active layer 4 between the first source electrode 5 and the first drain electrode 6 is protected from being eroded by a developer solution and an etching solution.

Wherein, the etching barrier layer 7 is made of material(s) that is resistant to the developer solution and the etching solution, such as one or more of silicon oxide (SiOx), silicon nitride (SiNx), hafnium oxide (HfOx) and silicon oxynitride (SiON). As the material (s) such as the silicon oxide (SiOx)

is not sensitive to the developer solution and the etching solution for etching the source electrode and the drain electrode, the active layer 4 can be prevented from be adversely affected by the developer solution and the etching solution for etching the source electrode and the drain electrode when the etching barrier layer 7 is made of such material(s), thereby meeting basic requirements of the oxide thin film transistor.

According to an embodiment of the present disclosure, the etching barrier layer 7 covers a portion of the first source electrode 5 and a portion of the first drain electrode 6 respectively, that is, the etching barrier layer 7 is formed posterior to forming the first source electrode 5 and the first drain electrode 6, for example, is deposited on the substrate 1 so as to cover a portion of the first source electrode 5 and a portion of the first drain electrode 6. As shown in FIG. 2, the etching barrier layer 7 at least covers a portion of the first source electrode 5 and a portion of the first drain electrode 6 adjacent to each other, so that when compared to a longer channel length D1 in prior arts where an etching barrier layer is formed prior to the source and drain electrodes, a channel length D2 of the thin film transistor according to embodiments of the present disclosure is shorter, that is, D2<D1.

In the above thin film transistor, the source electrode may further comprise the second source electrode 8 electrically connected with the first source electrode 5, the drain electrode may further comprise the second drain electrode 9 electrically connected with the first drain electrode 6, and the second source electrode 8 and the second drain electrode 9 are formed on the etching barrier layer 7. As shown in FIG. 2, the second source electrode 8 is at least partially located in a first through hole 11 (see FIGS. 4E and 4F) in the etching barrier layer 7 and electrically contacts the first source electrode 5, and the second drain electrode 9 is at least partially located in a second through hole 12 (see FIGS. 4E and 4F) in the etching barrier layer 7 and electrically contacting the first drain electrode 6.

As shown in FIG. 2, the second source electrode 8 at least covers and contacts a portion of the first source electrode 5 exposed through the first through hole 11, the second drain electrode 9 at least covers and contacts a portion of the first drain electrode 6 exposed through the second through hole 12. The second source electrode 8 and the second drain electrode 9 are formed after the etching barrier layer 7, and thus can cover a portion of the etching barrier layer 7. The first source electrode 5 is electrically connected to the second source electrode 8, and the first drain electrode 6 is electrically connected to the second drain electrode 9, thereby applying corresponding voltages to a source region and a drain region in the active layer 4 through the first source electrode 5 and the second source electrode 8, and the first drain electrode 6 and the second drain electrode 9 respectively.

The source electrode and the drain electrode are electrically connected or conducted with each other through the active layer 4.

As can be seen, the spacing distance D2 between the first source electrode 5 and the first drain electrode 6 is smaller than the spacing distance D1 between the first through hole 11 and the second through hole 12 in the etching barrier layer 7 (i.e., a length of the etching barrier layer 7 between the second source electrode 8 and the second drain electrode 9).

Specific definitions for the first source electrode, the first drain electrode, the second source electrode, and the second drain electrode are not particularly limited in the present disclosure, because whether an electrode located a specific position is a source electrode or a drain electrode will be determined according to its connection relationship to a pixel electrode. In present application, an electrode connected to a pixel electrode is defined as a drain electrode, the first source electrode corresponds to the second source electrode in position, and the first drain electrode corresponds to the second drain electrode in position.

In an embodiment of the present disclosure, the thin film transistor may further comprise an oxide layer 10 formed on the first source electrode 5 and the first drain electrode 6, and the oxide layer 10 is a metal oxide layer formed by thermally treating the first source electrode 5 and the first drain electrode 6. For example, after forming the first source electrode 5 and the first drain electrode 6, the first source electrode 5 and the first drain electrode 6 are thermally treated through an annealing process, so that the metal oxide layer 10 is formed in surfaces of the first source electrode 5 and the first drain electrode 6 upon thermally treatment. The thermally treatment is performed prior to forming the etching barrier layer 7, thus in the example shown in FIG. 2, the patterned metal oxide layer 10 is located between the etching barrier layer 7 and the first source electrode 5 and the first drain electrode 6.

It is particularly noted that during thermally treating the first source electrode 5 and the first drain electrode 6, metal atoms in the first source electrode 5 and the first drain electrode 6 will be doped into portions of the active layer 4 in contact with the first source electrode 5 and the first drain electrode 6, so that the active layer 4 contains therein the same metal atom as the first source electrode 5 and the first drain electrode 6, thereby enhancing the conductivity of the active layer 4, improving the ohmic contact between the source/drain electrodes and the active layer and increasing the stability of the oxide thin film transistor.

Optionally, the first source electrode 5 and the first drain electrode 6 may be thermally treated through an annealing process, which may be, for example, performed at an annealing temperature between 200° C. and 300° C. by an operating time of 0.5~3 hours in air atmosphere.

For example, if the first source electrode 5 and the first drain electrode 6 are made by metal aluminum material, then during the annealing process, a portion of a surface of the metal aluminum is oxidized as aluminum oxide ($Al_2O_3$) in an annealing environment while aluminum atoms in the first source electrode 5 and the first drain electrode 6 will enter the active layer 4 in contact with the first source electrode 5 and the first drain electrode 6, thereby improving conductivity of the active layer 4.

Figure 3:
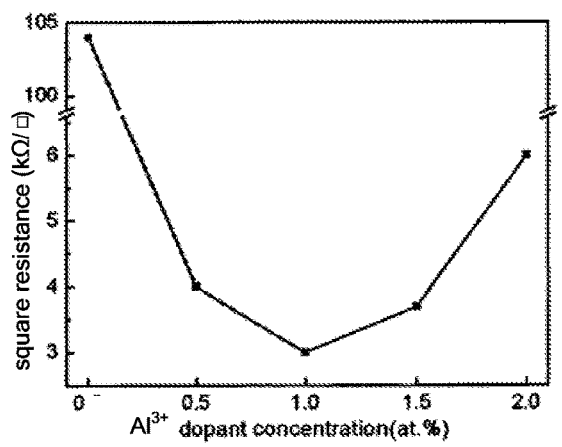
FIG. 3 is a graph illustrating a relationship between $Al^{3+}$ dopant concentration and electric conductivity of an active layer.

Specifically, during the annealing process, the aluminum atoms diffuse into the active layer 4, embed into oxide crystal lattices and replace zinc atoms, thereby generating oxygen vacancies and free electron carriers. The active layer is generally made by a zinc oxide material such as zinc oxynitride (ZnON), indium gallium zinc oxide (IGZO), indium zinc oxide (IZO), indium tin zinc oxide (ITZO) or the like. As $Al^{3+}$ has one more valence electron than $Zn^{2+}$ in the active layer, $Al^{3+}$ can lead to a trap of shallow energy level by the bounded electrons near a bottom of conduction band. Such a trap, however, has a very small binding force, so that the trapped electrons can be excited under a normal temperature and transited into the conduction band to become free electrons, this is the reason that the aluminum atoms can enhance the conductivity of the active layer 4. An effect of $Al^{3+}$ dopant concentration on the conductivity of the active layer is shown in FIG. 3. In FIG. 3, the horizontal axis represents $Al^{3+}$ dopant concentration in the active layer, and the vertical axis represents a "square resistance (kΩ/□)"

of the active layer. As can be seen from FIG. 3, thermally treating conditions may be controlled so that an appropriate number of Al atoms may diffuse into the active layer so as to obtain a suitable $Al^{3+}$ dopant concentration, thereby effectively reducing the square resistance of the active layer.

In addition, for a top gate type thin film transistor, the thin film transistor further comprises a gate insulating layer 3 located over the second source electrode 8 and the second drain electrode 9 and covering at least the portion of the etching barrier layer 7 between the first source electrode 5 and the first drain electrode 6, and a gate electrode 2 on the gate insulating layer 3.

For a bottom gate type thin film transistor, as shown in FIG. 2, the thin film transistor further comprises a gate electrode 2 formed on the substrate 1 and a gate insulating layer 3 formed over the gate electrode 2, that is, the gate insulating layer 3 is located between the active layer 4 and the gate electrode 2.

According to another aspect of the present disclosure, there is also provided an array substrate, comprising a substrate and the thin film transistor as described in any one of the above embodiments, formed on the substrate.

According to a further aspect of the present disclosure, there is also provided a display device, comprising the above mentioned array substrate.

According to a still further aspect of the present disclosure, there is also provided a method of manufacturing a thin film transistor, comprising the following steps:

In step 1, a semiconductor layer is formed on a substrate 1, and is patterned to form an active layer 4;

Optionally, a material for manufacturing the substrate 1 may include glass, silicon, quartz, plastic or the like, and preferably, is glass.

In the embodiment, the material of the active layer 4 may be a metal oxide, and preferably, be an oxide semiconductor material having high carrier mobility, such as zinc oxynitride (ZnON), indium gallium zinc oxide (IGZO), indium zinc oxide (IZO), indium tin zinc oxide (ITZO) or the like.

In the embodiment, the semiconductor layer may be formed through a sputtering technology or a plasma enhanced chemical vapor deposition (PECVD) technology. The approach for forming the semiconductor layer is not particularly limited in the present disclosure.

Optionally, the semiconductor layer may be patterned through a gray scale mask exposure process so as to form the active layer 4.

In step 2, a first electrode material layer is formed, for example, by depositing, on the substrate formed with the active layer 4, and is patterned to form a first source electrode 5 and a first drain electrode 6 on the active layer;

In the embodiment, the source electrode and the drain electrode are made of conductive materials, which are preferably metal materials, for example, common metals such as aluminum, zinc, tin, molybdenum, tungsten, titanium or the like, or metal alloy materials, preferably, aluminum or aluminum alloy. In one example, the first electrode material layer may be a thin layer when compared to a conventional electrode material layer, and, for example, has a thickness of about 100~500 Å.

In step 3, an etching barrier material layer is formed, for example, by depositing, on the substrate that is formed with the active layer 4, the first source electrode 5 and the first drain electrode 6, and is patterned to form the etching barrier layer 7, wherein, the etching barrier layer 7 at least covers a portion of the active layer 4 between the first source electrode 5 and the first drain electrode 6, that is, covers the channel region. In other words, at least portion of the active layer 4 corresponding to the channel region is covered by the etching barrier layer 7, so that the portion of the active layer 4 corresponding to the channel region between the first source electrode 5 and the first drain electrode 6 are protected from being eroded by a developer solution and an etching solution used in subsequent processes.

In the embodiment, the etching barrier layer 7 is made of material(s) that is resistant to the developer solution and the etching solution, such as one or more of silicon oxide (SiOx), silicon nitride (SiNx), hafnium oxide (HfOx) and silicon oxynitride (SiON). The material(s) such as the silicon oxide (SiOx) is not sensitive to the developer solution and the etching solution for etching source and drain electrodes, thus the active layer 4 can be prevented from be adversely affected by the developer solution and the etching solution for etching source and drain electrodes when the etching barrier layer 7 is made of such material(s), thereby meeting basic requirements of the oxide thin film transistor.

In step 3, since the etching barrier layer 7 is formed or deposited on the substrate 1 after forming the first source electrode 5 and the first drain electrode 6, the etching barrier layer 7 covers a portion of the first source electrode 5 and a portion of the first drain electrode 6 respectively. As shown in FIG. 2, the etching barrier layer 7 at least covers a portion of the first source electrode 5 and a portion of the first drain electrode 6 adjacent to each other, so that the channel length D2 is smaller than the channel length D1 of the conventional thin film transistor in prior art.

Figure 4A:
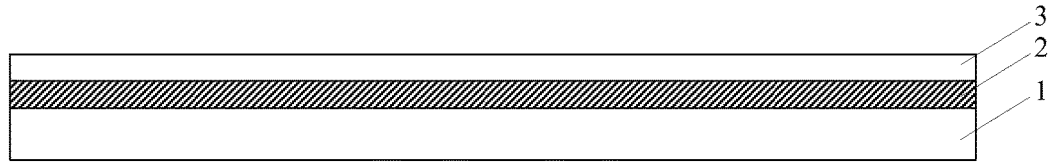
FIGS. 4A-4G are flowcharts of a process of manufacturing a thin film transistor according to an embodiment of the present disclosure.
Figure 4B:
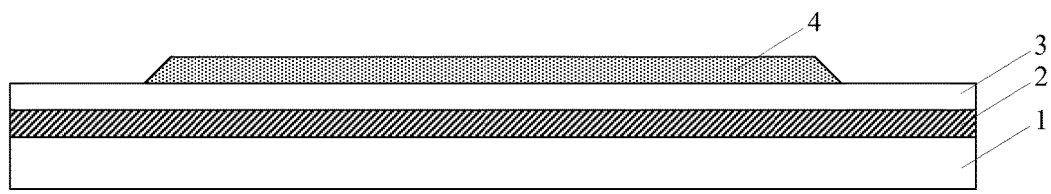
Figure 4C:
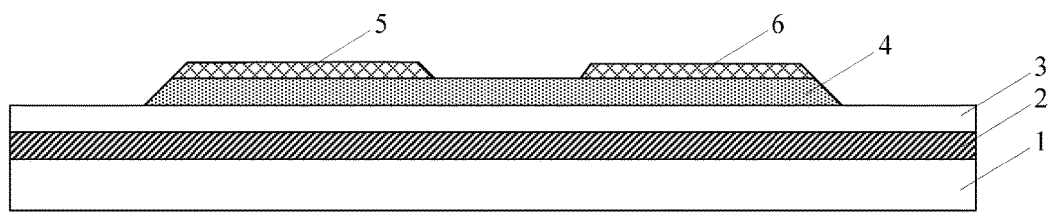
Figure 4D:
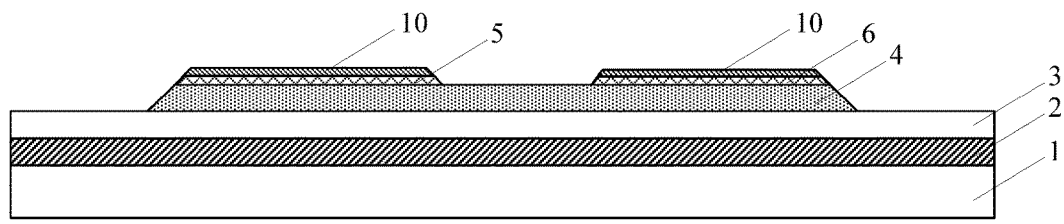
Figure 4E:
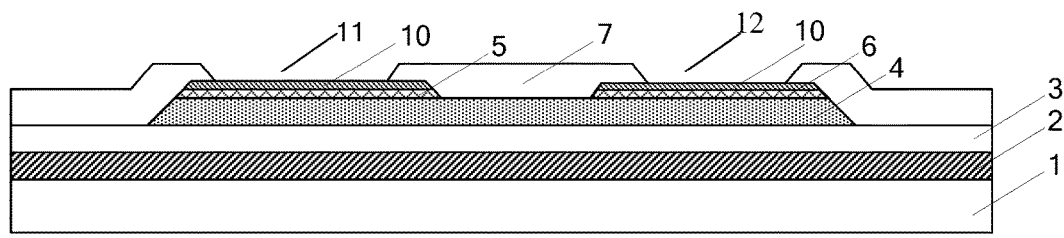
Figure 4F:
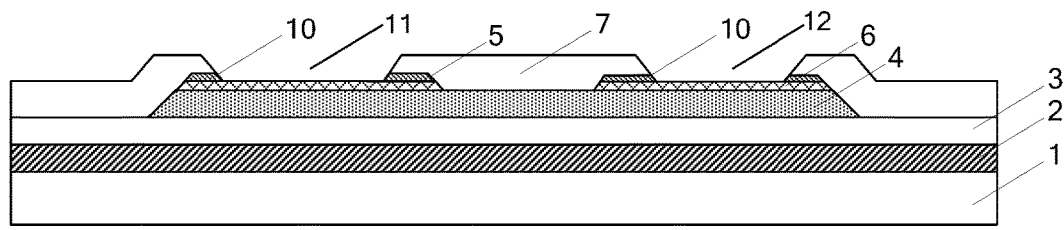

In step 3, when patterning the etching barrier material layer, a first through hole 11 to expose at least a portion of the first source electrode 5 and a second through hole 12 to expose at least a portion of the first drain electrode 6 may be formed in etching barrier material layer, as shown in FIGS. 4E and 4F.

The method may further comprise step 4, in which a second electrode material layer is formed, for example, by depositing, on the substrate 1, and is patterned to form a second source electrode 8 and a second drain electrode 9, wherein the second source electrode 8 is at least partially located in the first through hole 11 in the etching barrier layer 7 and is in electrical contact with the first source electrode 5, and the second drain electrode 9 is at least partially located in the second through hole 12 in the etching barrier layer 7 and is in electrical contact with the first drain electrode 6.

The second source electrode 8 and the second drain electrode 9 may be manufactured by using common processes for manufacturing source/drain electrodes. Optionally, the second source electrode 8 and the second drain electrode 9 may be formed through a process including such as exposure, development, etching and the like. The second electrode material layer may be made by a common electrode material used in semiconductor manufacturing processes, such as copper, and in one embodiment, the thickness of the second electrode material layer is larger than that of the first electrode material layer, and, exemplarily, the thickness of the second electrode material layer is about 2000~4000 angstroms (Å).

As described above, in embodiments of the present disclosure, the spacing distance (i.e., channel length) D2 between the first source electrode 5 and the first drain electrode 6 is smaller than the spacing distance D1 between the first through hole 11 and the second through hole 12 in the etching bather layer 7 (i.e., a length of the portion of the etching barrier layer 7 between the second source electrode 8 and the second drain electrode 9).

Specific definitions for the first source electrode, the first drain electrode, the second source electrode, and the second drain electrode are not particularly limited in any sense in the present disclosure, because whether an electrode located a specific position is a source electrode or a drain electrode will be determined according to its connection relationship to a pixel electrode. In present application, an electrode connected to a pixel electrode is defined as a drain electrode, the first source electrode corresponds to the second source electrode in position, and the first drain electrode corresponds to the second drain electrode in position.

In one embodiment of the present disclosure, the method further comprises, after forming the first source electrode 5 and the first drain electrode 6, thermally treating the first source electrode 5 and the first drain electrode 6 so as to form a metal oxide layer 10 in surfaces of the first source electrode 5 and the first drain electrode 6.

In this embodiment, when performing the subsequent patterning process to form the etching barrier layer 7, portions of the oxide layer 10 at positions corresponding to the through holes are also removed to expose a portion of the first source electrode or first drain electrode at the corresponding position(s), as shown in FIG. 4F, so that the subsequently formed second source electrode can be electrically connected to the first source electrode, and the second drain electrode can be electrically connected to the first drain electrode.

Optionally, surface layers of the first source electrode 5 and the first drain electrode 6 may be thermally treated through, such as, an annealing process;

Optionally, the annealing process may be performed at an annealing temperature between 200° C. and 300° C. by an operating time of 0.5~3 hours in air atmosphere.

It is particularly noted that during thermally treating the first source electrode 5 and the first drain electrode 6, metal atoms in the first source electrode 5 and the first drain electrode 6 will diffuse into portions of the active layer 4 in contact with the first source electrode 5 and the first drain electrode 6, so that the active layer 4 contains therein the same metal atoms as the first source electrode 5 and the first drain electrode 6, thereby enhancing the conductivity of the active layer 4, improving the ohmic contact between the source/drain electrodes and the active layer, and increasing the stability of the oxide thin film transistor.

For example, if metal aluminum is selected as a material for manufacturing the first source electrode 5 and the first drain electrode 6, a portion of surface of the metal aluminum will be oxidized as aluminum oxide ($Al_2O_3$) in an annealing environment during the annealing process, while aluminum atoms in the first source electrode 5 and the first drain electrode 6 will enter the active layer 4 in contact with the first source electrode 5 and the first drain electrode 6, thereby improving conductivity of the active layer 4.

Specifically, during the annealing process, the aluminum atoms diffuse into the active layer 4, embed into oxide crystal lattices and replace zinc atoms, thereby generating oxygen vacancies and free electron carriers. The active layer is generally made by a zinc oxide material such as zinc oxynitride (ZnON), indium gallium zinc oxide (IGZO), indium zinc oxide (IZO), indium tin zinc oxide (ITZO) or the like. As $Al^{3+}$ has one more valence electron than $Zn^{2+}$ in the active layer, $Al^{3+}$ can lead to a trap of shallow energy level by the bounded electrons near a bottom of conduction band. Such a trap, however, has a very small binding force, so that the trapped electron can be excited under a normal temperature and transited into the conduction band to become free electrons, this is the reason that the aluminum atoms can enhance the conductivity of the active layer 4. An effect of $Al^{3+}$ dopant concentration on the conductivity of the active layer is shown in FIG. 3. In FIG. 3, the horizontal axis represents $Al^{3+}$ dopant concentration in the active layer, and the vertical axis represents a "square resistance (k$\Omega$/□)" of the active layer.

In addition, when manufacturing a top gate type thin film transistor, the method further comprises: forming a gate insulating layer 3, which is located over the second source electrode 8 and the second drain electrode 9 and covers at least the portion of the etching barrier layer 7 between the first source electrode 5 and the first drain electrode 6, and forming a gate electrode 2 on the gate insulating layer 3.

Figure 4G:
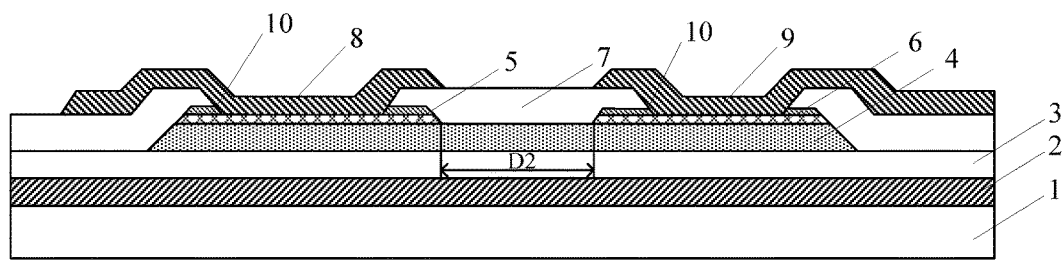

When manufacturing a bottom gate type thin film transistor, the method further comprises: before forming the active layer 4, forming a gate electrode 2 on the substrate 1 and forming a gate insulating layer 3 over the gate electrode 2, that is, the gate insulating layer 3 is located between the active layer 4 and the gate electrode 2, as shown in FIGS. 2 and 4G.

Hereafter, embodiment of the present disclosure will be described in detail by taking a bottom gate type thin film transistor as an example. As shown in FIGS. 4A-4G, a method of manufacturing the bottom gate type thin film transistor comprises the following steps:

In step 1, a gate electrode material layer and a gate insulating material layer are formed on a substrate 1 in order, and are patterned to obtain a gate electrode 2 and a gate insulating layer 3, as shown in FIG. 4A;

Optionally, a material for manufacturing the substrate 1 includes glass, silicon, quartz, plastic or the like, and preferably, is glass.

In the embodiment, the gate electrode 2 is made of a conductive material, preferably a metal material.

Optionally, the gate insulating layer 3 may be deposited through chemical vapour deposition (CVD), and is made of, preferably, an insulating material, which may be silicon dioxide, silicon nitride, silicon oxynitride or the like, or a combination thereof.

In step 2, a semiconductor layer is formed on the gate insulating layer 3 and is patterned to obtain an active layer 4, as shown in FIG. 4B;

In the embodiment, the material of the active layer 4 may be a metal oxide, and preferably, be an oxide semiconductor material having high carrier mobility, such as zinc oxynitride (ZnON), indium gallium zinc oxide (IGZO), indium zinc oxide (IZO), indium tin zinc oxide (ITZO) or the like.

In the embodiment, the semiconductor layer may be formed by using a sputtering technology or a plasma enhanced chemical vapor deposition (PECVD) technology, and the approach for forming the semiconductor layer is not particularly limited in any sense in the present disclosure.

Optionally, the semiconductor layer may be patterned through a gray scale mask exposure technology so as to form the active layer 4.

In step 3, a first electrode material layer is formed on the active layer 4, and is patterned to form a first source electrode 5 and a first drain electrode 6 on the active layer, as shown in FIG. 4C;

In the embodiment, the source electrode and the drain electrode are made by conductive materials, which are preferably metal materials, for example, common metal such as aluminum, zinc, tin, molybdenum, tungsten, titanium or the like, or metal alloy materials, preferably, aluminum or aluminum alloy.

In step 4, the first source electrode 5 and the first drain electrode 6 are thermally treated so as to form a metal oxide layer 10 in surfaces of the first source electrode 5 and the first drain electrode 6, as shown in FIG. 4D.

Optionally, the first source electrode 5 and the first drain electrode 6 may be thermally treated by, such as annealing process;

Optionally, the annealing process may be performed at an annealing temperature between 200° C. and 300° C. by an operating time of 0.5~3 hours in an air atmosphere.

It is particularly noted that during thermally treating the first source electrode 5 and the first drain electrode 6, metal atoms in the first source electrode 5 and the first drain electrode 6 will enter portions of the active layer 4 in contact with the first source electrode 5 and the first drain electrode 6, so that the active layer 4 contains therein the same metal atom as the first source electrode 5 and the first drain electrode 6, thereby enhancing the conductivity of the active layer 4, improving the ohmic contact between the source/drain electrodes and the active layer, and increasing the stability of the oxide thin film transistor.

For example, if the first source electrode 5 and the first drain electrode 6 are made by metal aluminum material, then during the annealing process, a surface portion of the metal aluminum is oxidized as aluminum oxide (Al2O3) in an annealing environment while aluminum atoms in the first source electrode 5 and the first drain electrode 6 will enter the active layer 4 in contact with the first source electrode 5 and the first drain electrode 6, thereby improving conductivity of the active layer 4. In one example, the first electrode material layer may be a thin layer, for example, when compared to a conventional electrode material layer, such as the second electrode material layer that is subsequently formed, and has a thickness of such as about 100~500 Å, thereby facilitating thermal processing and diffusion of the metal atoms into the active layer.

In step 5, an etching barrier material layer is formed on the substrate after forming the metal oxide layer 10, and is patterned to form the etching barrier layer 7, as shown in FIG. 4E. The etching barrier layer 7 at least covers a portion of the active layer 4 between the first source electrode 5 and the first drain electrode 6, that is, covers the channel region. In other words, at least the portion of the active layer 4 corresponding to channel region is covered by the etching bather layer 7, so that the portion of the active layer 4 corresponding to the channel region between the first source electrode 5 and the first drain electrode 6 are protected from being eroded by a developer solution and an etching solution used in subsequent processes.

In step 5, since the etching barrier layer 7 is formed or deposited on the substrate 1 after forming the first source electrode 5 and the first drain electrode 6, the etching barrier layer 7 respectively cover a portion of the first source electrode 5 and a portion of the first drain electrode 6. As shown in FIGS. 2 and 4G, the etching barrier layer 7 at least covers a portion of the first source electrode 5 and a portion of the first drain electrode 6 adjacent to each other, so that the channel length D2 is smaller than the channel length D1 of a conventional thin film transistor.

In step 5, when patterning the etching barrier material layer, a first through hole 11 to expose at least a portion of the first source electrode 5 and a second through hole 12 to expose at least a portion of the first drain electrode 6 may be formed in etching barrier material layer, as shown in FIGS. 4E and 4F.

It is particularly noted that when the etching barrier material layer is patterned to form the etching barrier layer 7, portions of the oxide layer 10 at positions corresponding to the through holes are also removed, as shown in FIG. 4F, to expose a portion of the first source electrode or the first drain electrode at the corresponding position(s), so that the subsequently formed second source electrode can be electrically connected to the first source electrode, and the second drain electrode can be electrically connected to the first drain electrode, thereby finally enabling the source and drain electrodes to be electrically connected with each other through the active layer.

In the embodiment, the etching barrier layer 7 is made of material(s) that is resistant to the developer solution and the etching solution, such as one or more of silicon oxide (SiOx), silicon nitride (SiNx), hafnium oxide (HfOx) and silicon oxynitride (SiON). As the material(s) such as the silicon oxide (SiOx) is not sensitive to the developer solution and the etching solution for etching source and drain electrodes, the active layer 4 can be prevented from be adversely affected by the developer solution and the etching solution for etching source and drain electrodes when the etching barrier layer 7 is made of such material(s), thereby meeting basic requirements of the oxide transistor.

In step 6, a second electrode material layer is formed (for example, by depositing) on the substrate 1, and is patterned to form a second source electrode 8 and a second drain electrode 9, as shown in FIG. 4G, wherein the second source electrode 8 is at least partially located in the first through hole 11 in the etching barrier layer 7 and is in electrical contact with the first source electrode 5, and the second drain electrode 9 is at least partially located in the second through hole 12 in the etching barrier layer 7 and is in electrical contact with the first drain electrode 6.

Optionally, the second source electrode 8 and the second drain electrode 9 may be formed through a process including such as exposure, development, etching and the like. The second electrode material layer for forming the second source and drain electrodes may be made of a conductive material, such as copper, and may have a thickness of, for example about 2000~4000 Å.

In embodiments of the present disclosure, the spacing distance, i.e., channel length D2, between the first source electrode 5 and the first drain electrode 6 is smaller than the spacing distance D1 between the first through hole 11 and the second through hole 12 in the etching barrier layer 7 (i.e., a length of the etching barrier layer 7 between the second source electrode 8 and the second drain electrode 9).

Specific definitions for the first source electrode, the first drain electrode, the second source electrode, and the second drain electrode are not particularly limited in the present disclosure, because whether an electrode located a specific position is a source electrode or a drain electrode will be determined according to its connection relationship to a pixel electrode. In present application, an electrode connected to a pixel electrode is defined as a drain electrode, the first source electrode corresponds to the second source electrode in position, and the first drain electrode corresponds to the second drain electrode in position.

In the method of manufacturing a thin film transistor and the obtained thin film transistor as described in any one of the above embodiments according to the present invention, on the one hand, the first source electrode and the first drain electrode are firstly formed on the active layer, then the etching barrier layer is formed on the substrate that is formed with the first source electrode and the first drain electrode so as to at least cover the portion of the active layer between the first source electrode and the first drain electrode and respectively cover a portion of the first source electrode and a portion of the first drain electrode adjacent to each other, and subsequently, the second source electrode and the second drain electrode are formed on the etching barrier layer; the second source electrode is at least partially located in first through hole and is in electrical contact with the first source electrode so as to constitute, together with the first source electrode, a source electrode of the thin film transistor, and the second drain electrode is at least partially located in second through hole and is in electrical contact with the first drain electrode so as to constitute, together with the first drain electrode, a drain electrode of the thin film transistor. When being supplied with power, the region between the first source electrode and the drain electrode forms a channel. As such, since the first source electrode and the first drain electrode are partially overlapped with or partially covered by the etching barrier layer, arrangement of the first source electrode and first drain electrode shortens a carrier transporting distance between the source and drain electrodes, and accordingly reduces the channel length of the thin film transistor, so that the channel length D2 of the thin film transistor manufactured according to the above technical solutions of the present disclosure is smaller than the channel length D1 of a conventional thin film transistor in prior arts. The shortened channel length may reduce dimensions of the thin film transistor, increase the aperture opening ratio of the liquid crystal panel, and reduce energy consumption; and the shortened channel length may increase the on-state current of the thin film transistor and charging efficiency, thereby greatly improving the overall performance of the thin film transistor and facilitating development of high-resolution products. On the other hand, according to embodiments of the present disclosure, after having been formed, the first source electrode and the first drain electrode are further thermally treated. Metal atoms in the first source electrode and the first drain electrode enter the active layer in contact with the first source electrode and the first drain electrode during annealing, thereby enhancing the conductivity of the active layer, improving the ohmic contact between the source and drain electrodes and the active layer, and increasing the stability of the oxide thin film transistor.

Purposes, technical solutions and advantageous effects of the present invention have been further illustrated in the above specific embodiments. It should be understood that the above description is merely used to illustrate specific embodiments of the present invention, but not to limit the present invention. All of changes, equivalent alternatives, improvements, made within principles and spirit of the disclosure, should be included within the scope of the present invention.

What is claimed is:

1. A thin film transistor, comprising an active layer, an etching barrier layer, a gate electrode, a gate insulating layer, a source electrode and a drain electrode, wherein:
   the source electrode comprises a first source electrode and a second source electrode, the drain electrode comprises a first drain electrode and a second drain electrode, and the first source electrode and first drain electrode are formed on the active layer and directly contact the active layer;
   the etching barrier layer at least covers a portion of the active layer between the first source electrode and the first drain electrode, and includes portions located on upper surfaces of the first source electrode and the first drain electrode to cover a portion of the first source electrode and a portion of the first drain electrode adjacent to each other respectively;
   the second source electrode and the second drain electrode are formed on the etching barrier layer, the second source electrode is electrically connected with the first source electrode and the second drain electrode is electrically connected with the first drain electrode; and
   the thin film transistor further comprises a metal oxide insulation layer formed on the first source electrode and the first drain electrode and between the first source electrode and the first drain electrode and the etching barrier layer.

2. The thin film transistor according to claim 1, wherein a first through hole and a second through hole are formed in the etching barrier layer at positions respectively corresponding to the first source electrode and the first drain electrode, the second source electrode is at least partially located within the first through hole and in electrical contact with the first source electrode, and the second drain electrode is at least partially located within the second through hole and in electrical contact with the first drain electrode.

3. The thin film transistor according to claim 2, wherein a spacing distance between the first source electrode and the first drain electrode is smaller than a spacing distance between the first through hole and the second through hole in the etching barrier layer.

4. The thin film transistor according to claim 2, wherein:
   the first source electrode and the first drain electrode are formed by a same first electrode material layer deposited on the active layer, and the second source electrode and the second drain electrode formed by a same second electrode material layer deposited on the etching barrier layer, and
   a thickness of the same first electrode material layer is smaller than that of the same second electrode material layer.

5. The thin film transistor according to claim 1, wherein the metal oxide insulation layer is formed by thermally treating the first source electrode and the first drain electrode.

6. The thin film transistor according to claim 5, wherein a material for manufacturing the first drain electrode and/or first source electrode comprises aluminum or aluminum alloy.

7. The thin film transistor according to claim 1, wherein the active layer is formed by a metal oxide semiconductor material.

8. The thin film transistor according to claim 7, wherein the metal oxide semiconductor material comprises a zinc oxide material.

9. The thin film transistor according to claim 7, wherein the active layer contains therein the same metal atoms as the first source electrode and the first drain electrode.

10. An array substrate, comprising a substrate and the thin film transistor according to claim 1 formed on the substrate.

11. A method of manufacturing a thin film transistor, comprising:
   forming a semiconductor layer on a substrate, and patterning the semiconductor layer to form an active layer;
   forming a first electrode material layer on the substrate formed with the active layer, and patterning the first electrode material layer to form a first source electrode and a first drain electrode on the active layer;
   thermally treating the first source electrode and the first drain electrode so as to form a metal oxide insulation layer in surfaces of the first source electrode and the first drain electrode;
   forming an etching barrier material layer on the substrate formed with the first source electrode and the first drain electrode, and patterning the etching barrier material layer to form an etching barrier layer such that the metal oxide insulation layer is disposed between the first source electrode and the first drain electrode and the etching barrier layer, the etching barrier layer at least covering a portion of the active layer between the first source electrode and the first drain electrode and including portions located on upper surfaces of the first source electrode and the first drain electrode to cover a portion of the first source electrode and a portion of the first drain electrode adjacent to each other respectively; and forming a second electrode material layer on the substrate formed with the etching barrier layer, and patterning the second electrode material layer to form a second source electrode and a second drain electrode, wherein the first source electrode is electrically connected with the second source electrode, and the first drain electrode is electrically connected with the second drain electrode.

12. The method according to claim 11, wherein the step of patterning the etching barrier material layer comprises:

forming, in the etching barrier material layer, a first through hole to expose at least a portion of the first source electrode and a second through hole to expose at least a portion of the first drain electrode, wherein the second source electrode is at least partially located within the first through hole and is in electrical contact with the first source electrode, and the second drain electrode is at least partially located within the second through hole and in electrical contact with the first drain electrode.

13. The method according to claim 12, wherein a spacing distance between the first source electrode and the first drain electrode is smaller than a spacing distance between the first through hole and the second through hole in the etching barrier layer.

14. The method according to claim 12, wherein a thickness of the first electrode material layer is smaller than that of the second electrode material layer.

15. The method according to claim 11, wherein the first source electrode and the first drain electrode are thermally treated through an annealing process.

16. The method according to claim 15, wherein a material for manufacturing the first drain electrode and/or first source electrode comprises aluminum or aluminum alloy.

17. The method according to claim 11, wherein the active layer is formed by a metal oxide semiconductor material.

18. The method according to claim 17, wherein the metal oxide semiconductor material comprises a zinc oxide material.

19. The method according to claim 11, further comprising, after forming the first source electrode and the first drain electrode, thermally treating the first source electrode and the first drain electrode so that the active layer contains therein the same metal atoms as the first source electrode and the first drain electrode.

\* \* \* \* \*